(12) United States Patent
Feuillet et al.

(10) Patent No.: US 10,892,378 B2
(45) Date of Patent: Jan. 12, 2021

(54) METHOD OF MAKING A SEMI-POLAR NITRIDE LAYER ON A CRYSTALLINE SUBSTRATE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Guy Feuillet, Saint-Martin D'Uriage (FR); Michel El Khoury Maroun, Antibes (FR); Philippe Vennegues, Antibes (FR); Jesus Zuniga Perez, Biot (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 2 days.

(21) Appl. No.: 16/078,203

(22) PCT Filed: Feb. 21, 2017

(86) PCT No.: PCT/EP2017/053830
§ 371 (c)(1),
(2) Date: Aug. 21, 2018

(87) PCT Pub. No.: WO2017/144429
PCT Pub. Date: Aug. 31, 2017

(65) Prior Publication Data
US 2019/0081204 A1 Mar. 14, 2019

(30) Foreign Application Priority Data
Feb. 22, 2016 (FR) ..................... 16 51433

(51) Int. Cl.
*H01L 33/00* (2010.01)
*C30B 25/18* (2006.01)
(Continued)

(52) U.S. Cl.
CPC .......... *H01L 33/007* (2013.01); *C30B 25/186* (2013.01); *C30B 29/406* (2013.01);
(Continued)

(58) Field of Classification Search
CPC ....... H01L 33/007; H01L 33/12; H01L 33/16; H01L 33/32; H01L 33/02
See application file for complete search history.

(56) References Cited

U.S. PATENT DOCUMENTS 10,134,727 B2 * 11/2018 Then .................... H01L 27/0629
10,553,426 B2 * 2/2020 Feuillet ............... H01L 21/0254
(Continued)

FOREIGN PATENT DOCUMENTS

WO WO 2015/160903 A1 10/2015
WO WO 2016/202899 A1 12/2016

OTHER PUBLICATIONS

International Search Report and Written Opinion dated May 4, 2017 in PCT/EP2017/053830, 12 pages (with English translation).
(Continued)

*Primary Examiner* — Andrew Q Tran
(74) *Attorney, Agent, or Firm* — Oblon, McClelland, Maier & Neustadt, L.L.P.

(57) ABSTRACT

A method is provided for obtaining a semi-polar nitride layer obtained from a gallium and nitrogen based material on an upper surface of a crystalline substrate of cubic symmetry, including: etching parallel grooves from the upper surface having two opposed inclined facets, one having a crystalline orientation <111>; forming a mask above the upper surface such that the facets having <111> orientation are not
(Continued)

masked; and then forming the layer by epitaxial growth from the non-masked facets, including: a first epitaxial growth phase to form a seed in parallel grooves; interrupting the first phase when the seed has an inclined facet having a crystalline orientation 0001 and an upper facet having a crystalline semi-polar orientation $10\bar{1}1$; a surface treatment step including modifying an upper portion of the seed to include silicon; and a second epitaxial growth phase from the inclined facet, continuing until coalescence of seeds of adjacent parallel grooves.

18 Claims, 5 Drawing Sheets

(51) Int. Cl.
C30B 29/40 (2006.01)
H01L 33/12 (2010.01)
H01L 33/16 (2010.01)
H01L 33/32 (2010.01)

(52) U.S. Cl.
CPC ............ *H01L 33/12* (2013.01); *H01L 33/16* (2013.01); *H01L 33/32* (2013.01)

(56) References Cited

U.S. PATENT DOCUMENTS

2012/0276722 A1 11/2012 Chyi et al.
2017/0047220 A1 2/2017 Han et al.

OTHER PUBLICATIONS

Waltereit, P. et al. "Nitride semiconductors free of electrostatic fields for efficient white light-emitting diodes" letters to nature, Macmillan Magazines Ltd, vol. 406, 2000, pp. 865-868.

Romanov, A.E. et al. "Strain-induced polarization in wurtzite III-nitride semipolar layers" Journal of Applied Physics, American Institute of Physics, vol. 100, 2006, pp. 023522-1-023522-10 and cover Page.

Fujito, K. et al. "High-quality nonpolar m-plane GaN substrates grown by HVPE" Physics Status Solidi A, vol. 205, No. 5, 2008, pp. 1056-1059.

Hashimoto,T. et al. "A GaN bulk crystal with improved structural quality grown by the ammonothermal method" Nature Materials, vol. 6, 2007, pp. 568-571.

Grzegory, I. et al. "GaN substrates for molecular beam epitaxy growth of homoepitaxial structures" Thin Solid Films, Elsevier, vol. 367, 2000, pp. 281-289.

Honda, Y. et al. "Growth of (1101) GaN on a 7-degree off-oriented (001)Si substrate by selective MOVPE" Journal of Crystal Growth, Elsevier, vol. 242, 2002, pp. 82-86.

Tanikawa, T. et al. "Growth of semi-polar (11-22)GaN on a (113)Si substrate by selective MOVPE" Physics Status Solidi C, vol. 5, No. 9, 2008, pp. 2966-2968.

Khoury, M. et al. "Growth of semipolar (2021) GaN layers on patterned silicon (114) 1° off by Metal Organic Vapor Phase Epitaxy" Journal of Crystal Growth, Elsevier, vol. 419, XP055313417, 2015, pp. 88-93.

Okada, N. et al. "Growth of Semipolar (1122) GaN Layer by Controlling Anisotropic Growth Rates in r-Plane Patterned Sapphire Substrate" Applied Physics Express, The Japan Society of Applied Physics, vol. 2, No. 9, 2009, pp. 091001-1 to 091001-3 and cover Page.

Tendille, F. et al. "Defect reduction method in (11-22) semipolar GaN grown on patterned sapphire substrate by MOCVD: Toward heteroepitaxial semipolar GaN free of basal stacking faults" Journal of Crystal Growth, Elsevier, vol. 2014, 404, pp. 177-183.

Dadgar, A. et al. "Eliminating stacking faults in semi-polar GaN by AlN interlayers" Applied Physics Letters, American Institute of Physics, vol. 99, 2011, pp. 021905-1 to 021905-3.

Ansah Antwi, K.K. et al. "Crystallographically tilted and partially Strain relaxed GaN grown on inclined {111} facets etched on Si(100) substrate" Journal of Applied Physics, vol. 114, No. 24, XP012184193, 2013, pp. 243512-1 to 243512-9.

\* cited by examiner

Prior Art

Prior Art

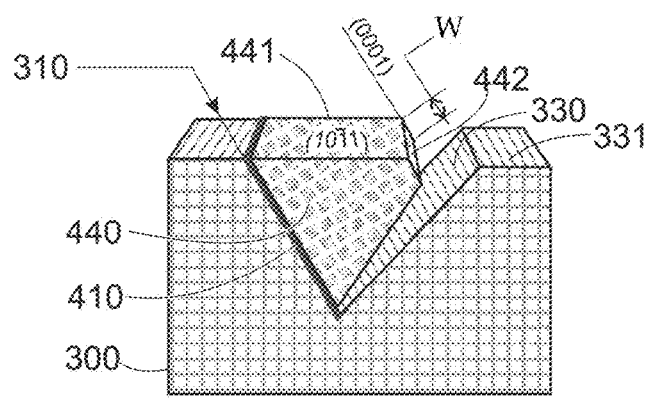
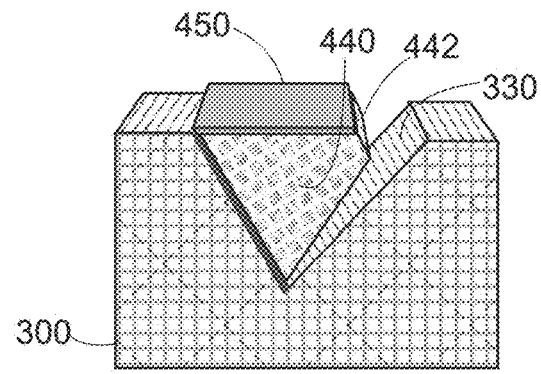
Figure 4a
Figure 4b
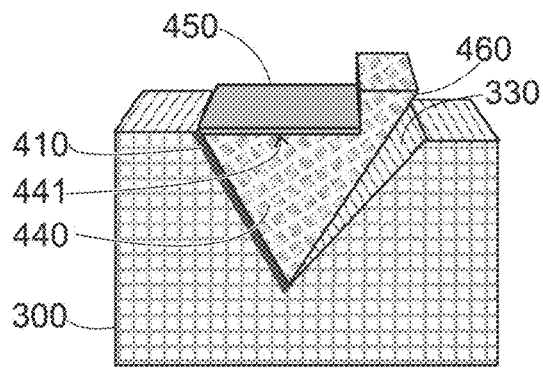
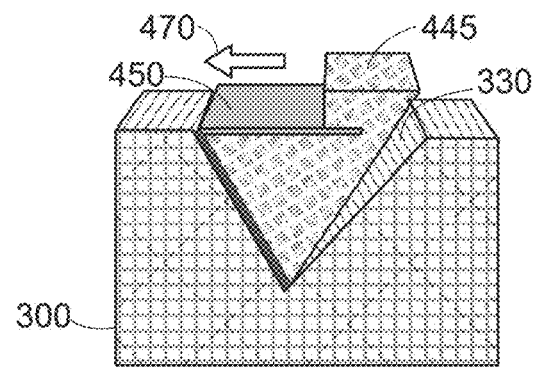
Figure 4c
Figure 4d
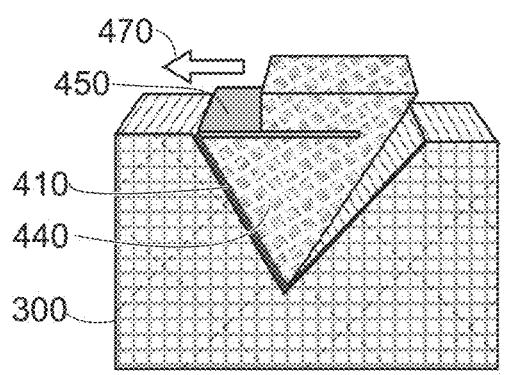
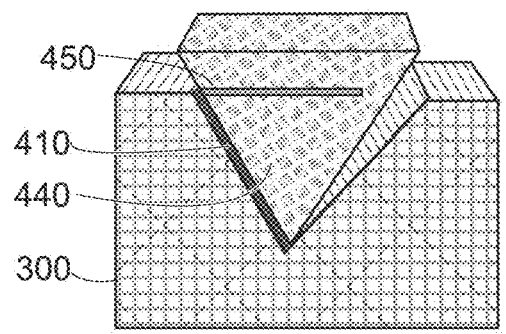
Figure 4e
Figure 4f

METHOD OF MAKING A SEMI-POLAR NITRIDE LAYER ON A CRYSTALLINE SUBSTRATE

TECHNICAL FIELD OF THE INVENTION

The present invention in general relates to the techniques for growing semi-polar layers of nitride (N) obtained from a material taken from gallium (Ga), indium (In) and aluminium (Al) on an upper surface of a crystalline layer.

The invention finds advantageous application to the field of light emitting diodes (LED).

PRIOR ART

All modern commercial optoelectronic devices and, in particular, light emitting diodes (LED) with high light intensity that have already started to replace incandescent light bulbs due to their much lower power consumption, use semi-conductor materials made from alloys based on gallium nitride (GaN) and other materials such as indium (In) and aluminium (Al). These materials are obtained in structures in layers where, typically, hetero-epitaxial growth of the active layer of the GaN-based material must be carried out based on a substrate made of a different material.

As shown in FIG. 1, the stable crystallographic shape of GaN-based alloys is the crystalline structure known as "wurtzite". In said hexagonal structure 100, it is convenient to define crystalline planes such as the "c" plane 110; the "a" plane 120 and the "m" plane 130. As it experimentally turned out to be easier to get GaN-based materials to grow in the direction of the "c" axis 112, perpendicular to the plane of the same name, direction also qualified as polar, most of the devices are produced in said direction. However, a negative consequence of said direction of growth is that it enables the effect known as "Quantum Confined Stark Effect" (QCSE) to be developed.

Said effect, which is induced by the strong internal polarisation electric fields that develop in the GaN layers, the growth of which was performed along the c or polar axis, in particular, results in a significant reduction of the efficiency of recombination of electron-hole pairs in the quantum dots of the diode and thus in a significant loss of light efficiency of said LEDs.

To overcome the problems related to the presence of said strong electric fields, it was envisaged to grow the GaN along the different crystallographic planes of the polar axis. As illustrated in FIG. 1, the a and m planes, 120 and 130, are planes in non-polar directions. A growth in an intermediate plane, for example 140, can also be envisaged in a direction known as semi-polar.

FIG. 2 illustrates how the total polarisation discontinuity varies at the interfaces in a heterostructure with GaN/InGaN quantum dots depending on the angle of inclination in relation to the c axis. It can be noted that said polarisation discontinuity is in fact maximum 210 for the polar orientation (0°) and null 220 for the non-polar orientation (90°). It also passes through zero 230 for a semi-polar orientation (about 45°).

Various techniques have indeed been proposed for obtaining a growth, in particular, semi-polar, of GaN-based layers thus significantly reducing the polarisation effects. These have made it possible to obtain a significant improvement of the performances of LEDs produced in this way, but by epitaxy on GaN substrates. Said substrates further being of limited size and of prohibitive cost, said techniques turned out to be unlikely for industrialisation. Moreover, said techniques must make it possible to produce layers or templates otherwise free of any crystallographic defects at least having sufficiently low levels of defects in order to obtain high manufacturing yields and thus low production costs.

Thus, one aim of the present invention consists of proposing a solution for resolving some at least of said constraints.

More specifically, one aim of the invention consists of proposing a solution likely to be able to produce at low cost in an industrial environment substrates, in particular, of semi-polar orientation of large size having a low level of crystallographic defects. Said substrates, also called pseudo-substrates, may, for example, be used as the basis for the epitaxial formation of other structures such as LEDs, for example.

The other aims, features and advantages of the present invention will appear upon examination of the following description and accompanying drawings. It is understood that other advantages may be incorporated.

ABSTRACT OF THE INVENTION

According to one embodiment, the present invention relates to a method for obtaining at least one semi-polar layer of nitride obtained using at least one gallium (Ga) and nitrogen (N) based material on an upper surface of a crystalline substrate, the method comprising at least one of the steps of:
  etching a plurality of, preferably, parallel grooves from the upper surface of the crystalline substrate, each groove comprising at least two opposed inclined facets, at least one of said two opposed facets having a crystalline orientation {111};
  forming a mask above the upper surface of the crystalline substrate such that the facets opposite to said facets having a crystalline orientation {111} are masked and that said facets having a crystalline orientation {111} are not masked;
  forming said semi-polar nitride layer by epitaxial growth from said non-masked facets having a crystalline orientation {111}.

Said step of forming said semi-polar layer comprises at least the following steps
  at least one first epitaxial growth phase, carried out from said non-masked facets having a crystalline orientation {111} in such a way as to form a seed in a plurality at least of parallel grooves;
  interruption of the first epitaxial growth phase when said seed has an inclined facet having a crystalline orientation (0001) and an upper facet having a crystalline semi-polar orientation (10$\bar{1}$1);
  a surface treatment step comprising a modification of an upper portion of the seed by placing the seed in presence with at least one gas comprising silicon (Si) in such a way as to form on the surface of the seed a modified portion comprising silicon (Si);
  at least one second epitaxial growth phase of said material, carried out from said inclined facet having a crystalline orientation (0001).

It turned out that the presence of the modified portion comprising silicon makes it possible to stop or deviate the defects and dislocations that propagate from the facets of the crystalline substrate that have a crystalline orientation {111} and, more specifically, from the Si {111}/GaN or Si {111}/AlN/GaN interface if a layer of AlN was formed before growth of the GaN.

The dislocations from the facets of the substrate having a crystalline orientation {111}, incline during the growth of the seed and lead on to the upper semi-polar facet having a crystalline orientation (0001).

The defects and dislocations do not reach, or rarely reach, the inclined facets of the seed that have a crystalline orientation (0001). During the second epitaxial growth phase, the semi-polar layer grows from said inclined facets having a crystalline orientation (0001) and cover the top of the modified portion comprising silicon that sits on top of the upper facet of the seed. Thus, above the modified portion comprising silicon, the semi-polar layer has few or no defects and dislocations.

Preferably, the second epitaxial growth phase being continued until coalescence of seeds of adjacent parallel grooves.

Thus, the invention makes it possible to significantly improve the quality of the components obtained.

Optionally, the method of the invention may further have at least any one of the features and optional steps taken separately or in combination:

According to one embodiment, during the second epitaxial growth phase said semi-polar layer of nitride (GaN) covers one part at least of the modified portion comprising silicon.

According to one embodiment, the modified portion comprising silicon is continuous on said upper facet of the seed. The modified portion comprising silicon makes it possible to block or deviate the dislocations propagating in the seed from the facet of the substrate having a crystalline orientation {111}.

According to one embodiment, the modified portion comprising silicon is absent or discontinuous on the inclined facet having a crystalline orientation (0001).

According to one embodiment, the modified portion comprising silicon has on said inclined facet a thickness thinner than on the upper facet and sufficiently thin for enabling a resumption of epitaxial growth of said material from said inclined facet having a crystalline orientation (0001).

The crystalline substrate is a silicon-based material. For example, it consists of silicon.

According to one embodiment, the modified portion comprising silicon comprises gallium (Ga), nitrogen (N) and silicon (Si).

According to one embodiment, the modified portion comprising silicon that is present on the upper facet has a thickness strictly greater than one monoatomic layer and preferably greater than or equal to sixteen monoatomic layers. According to one embodiment, the modified portion comprising silicon present on the upper facet has a thickness strictly greater than 0.3 nm, preferably greater than 4 nm and preferably greater than 5 nm.

According to one embodiment, the modified portion comprising silicon present on the inclined facet has a thickness equal to one single monoatomic layer. According to one embodiment, the modified portion comprising silicon present on the inclined facet has a thickness equal to or less than 0.3 nm According to one embodiment, said modification of an upper portion of the seed comprises an exposure of the seed to a combined flow of gas comprising SiH4 and NH3.

According to one embodiment, said modification of an upper portion of the seed comprises an exposure of the seed to a combined flow of gas comprising SiH4 and NH3 and the thickness of the modified portion is controlled by regulating, in particular, the SiH4 and NH3 flow ratio and/or by regulating the exposure time, that is the gas injection time.

According to one embodiment, the thickness of the modified portion comprising silicon is controlled by regulating at least one of the following parameters: flow rate of at least one gas, temperature and injection pressure of at least one gas comprising silicon.

There where the seed is modified to form said portion comprising Si, no appearance of a different crystallinated layer can be seen. Only a chemical contrast variation is observed at said interface. The treatment time, temperature, pressure of the reactor and the gas flows used for this treatment are the adjustment parameters that control the thickness of said interfacial portion forming an area for blocking dislocations.

Advantageously and according to the invention, said "in situ" formation enables a modified area comprising silicon to be formed automatically which is discontinuous on the inclined facet and continuous on the upper facet. Said "in situ" deposition makes it possible to form a very thin and carefully controlled layer.

According to one embodiment, at least the first epitaxial growth phase is performed in a reactor and the step for modifying an upper portion of the seed is performed in the same reactor.

According to one embodiment, the modification of an upper portion of the seed is performed by metalorganic chemical vapour deposition (MOCVD). Thus, the surface treatment is carried out in situ in the same MOCVD epitaxial frame as that used for the growth of the GaN.

According to one embodiment, said interruption is triggered after a predetermined period depending on the conditions used of which figure: gas flow, temperature, pressure.

According to one embodiment, the silicon content of the modified portion located above the upper facet having a crystalline semi-polar orientation (10$\bar{1}$1) is between 3% and 20% and, preferably, between 3% and 10% in atomic percentage.

The upper facet having a crystalline orientation (0001) is semi-polar.

According to one embodiment, the nitride is gallium nitride (GaN).

Moreover, also optionally, the method of the invention may further have at least any one of the features and optional steps taken separately or in combination:

According to one embodiment, the material is GaN and before the epitaxial growth stage of said material from the facets having a crystalline orientation {111}, a buffer layer of AlN is formed on the facets having a crystalline orientation {111}.

Thus, said epitaxial growth stage comprises:
a first epitaxial growth of an aluminium nitride (AlN) based material from said non-masked facets having a crystalline orientation {111};
then at least one second epitaxial growth of a gallium nitride (GaN) based material from said aluminium nitride (AlN) based material.

In particular, this makes it possible to avoid the contact between GaN and the silicon of the substrate and thus reduce the risks of melt back etching type deterioration.

According to one embodiment, said main direction in which the grooves lie, corresponds to a common direction in the plane of said upper surface of the crystalline substrate and in the plane (111) of said substrate.

The substrate is selected from the materials likely to enable the growth of a semi-polar nitride layer obtained from a gallium (Ga) and nitrogen (N) based material.

The substrate is selected from the materials likely to reveal by etching the facets having a crystalline orientation <111>. According to one embodiment, the crystalline substrate is of cubic symmetry.

According to one embodiment, the crystalline substrate is based on one of the following materials, optionally doped, or is formed of one of the following materials or of an alloy of the following materials: Si, Ge, GaAs.

A substrate "based" on a given material means that the substrate may be formed of said material only or of said material doped with another material.

According to one embodiment, the substrate is based on or is made of monocrystalline or crystalline silicon. In this case, it may concern a solid silicon substrate or a silicon-on-insulator (SOI) type developed substrate. In said both cases, the upper surface of the crystalline substrate is made of crystalline silicon.

According to one non-limiting embodiment, the V/III mole ratio of said material comprising nitride (N) and at least one from gallium (Ga), between 50 and 7000.

According to one non-limiting embodiment, said V/III mole ratio of said material comprising nitride (GaN) and gallium (Ga) is between 400 and 800 and, preferably, between 550 and 750.

According to one embodiment, the step of forming a mask comprises a directive deposition of a masking material, carried out such that all of the crystalline substrate is covered with the exception of said facets that have a crystalline orientation {111}.

According to one embodiment, the masking material comprises at least one of the following materials: silicon oxide (SiO2), silicon nitride (SiN), titanium nitride (TiN).

According to one embodiment, the plurality of parallel grooves has an interval p1 which is between 50 nm and 20 μm.

According to another embodiment, the aim of the present invention is a microelectronic device comprising at least one semi-polar layer of nitride (N) of a material taken from gallium (Ga), the semi-polar layer comprising a flat portion and a plurality of pyramid-shaped portions extending from the flat portion. The device comprises within each pyramid-shaped portion or at the base of each pyramid-shaped portion, a portion of GaN incorporating silicon and possibly forming SiN.

More specifically, said portion of the seed comprises gallium atoms, silicon atoms and nitrogen atoms.

According to one embodiment, said modified portion comprising silicon has at least one flat part which is parallel to the flat portion and the thickness of which is strictly greater than 1 monolayer, i.e., strictly greater than 0.3 nm.

According to another embodiment, the aim of the present invention is one or more light emitting diodes (LED) comprising a microelectronic device according to the invention.

BRIEF DESCRIPTION OF THE FIGURES

The aims, subject matter, as well as the features and advantages of the invention will be clear from the detailed description of an embodiment of said latter which is illustrated by the following accompanying drawings wherein.

Figure 1:
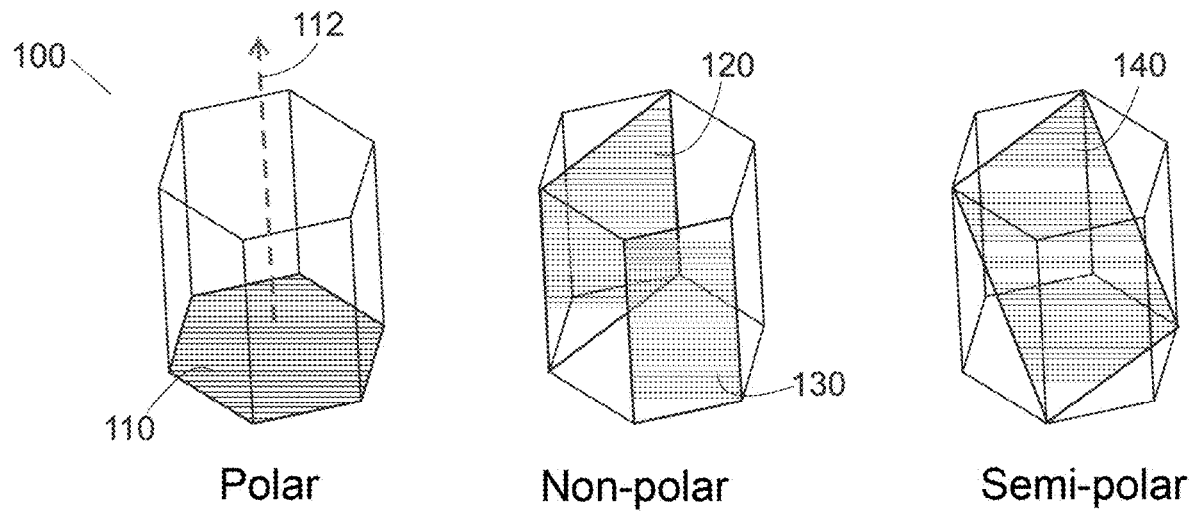
FIG. 1 illustrates the hexagonal crystallographic structure of GaN-based alloys and the polar, non-polar and semi-polar growth planes.
Figure 2:
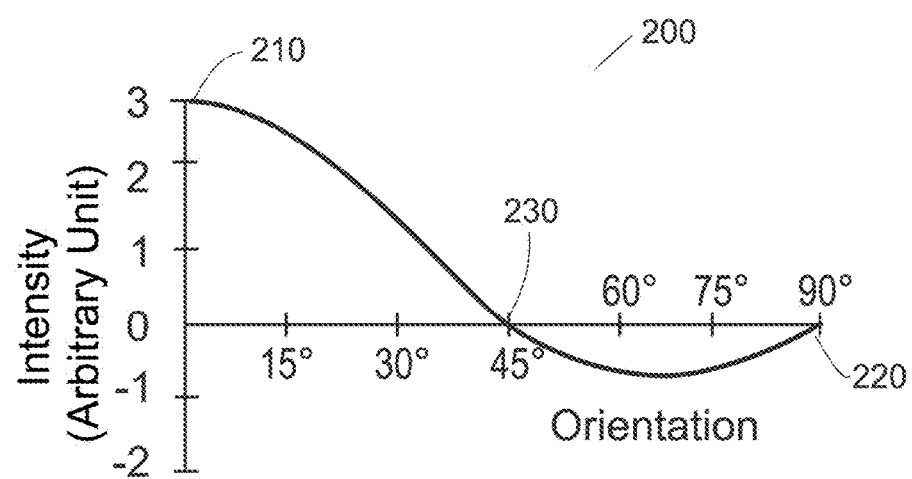
FIG. 2 shows the discontinuity of the total polarisation which develops depending on the orientation of the epitaxial growth.

The figures are given by way of examples and are not restrictive of the invention. They are schematic representations, intended to facilitate the understanding of the invention and therefore are not necessarily to the same scale as the practical applications. In particular, the relative thicknesses of the various layers and seeds are not representative of the reality.

DETAILED DESCRIPTION OF THE INVENTION

It is specified that in the context of the present invention, the term "on", "sits on top of", "covers" or "underlying" or their equivalents do not necessarily mean "in contact with". Thus, for example, the deposition of a first layer on a second layer, does not necessarily mean that the two layers are directly in contact with one another but this means that the first layer covers at least partially the second layer by being either directly in contact therewith, or by being separated therefrom by at least one other layer or at least one other element.

In the following description, the thickness or the height is taken in a direction perpendicular to the main faces of the various layers. In the figures, the thickness or the height is taken according to the vertical.

Similarly, when it is indicated that an element is located in line with another element, this means that said two elements are both located along the same perpendicular line in the main drawing of the substrate, i.e. along the same line oriented vertically in the figures.

FIG. 3, consisting of FIGS. 3a to 3d, illustrates a type of technique for overcoming the problems previously mentioned and related to a crystalline growth of a GaN-based material along a polar axis. FIG. 3 mainly relates to techniques wherein growing a GaN-based layer of semi-orientation is achieved starting from inclined facets 310 of V-shaped grooves 320 created on the surface of the starting substrate 300. The growth is carried out according to a method that was initially proposed by a group of Japanese scientists and published in English in 2002 in the "Journal of crystal growth", vol. 242(1), pages 82-86, under the title "Growth of (1101) GaN on a 7-degree off-oriented (001) Si substrate by selective MOVPE" by Yoshio Honda and his co-authors.

As illustrated in FIG. 3, the basic idea developed in the above-mentioned publication is to make it possible that the epitaxial growth is carried out mainly from only one facet 310, 311 of each groove 320 previously created by etching on the surface of a substrate 300 which has moreover been selected in this case with a crystalline orientation offset by seven degrees of angle in relation to the plane (001) such as defined by the standard crystallographic orientation index known as the Miller index.

As indicated, the opposed facets 310, 311 of each groove 320 of the silicon substrate therefore have a crystallographic orientation which is respectively de ($\bar{1}\bar{1}1$) and (111). The grooves 320 lie in the longest lengths thereof in a main direction contained in a plane parallel to the plane wherein the substrate mainly extends. Said main direction is common to the plane of the upper surface of the substrate 300 and to the plane (111).

For a silicon substrate 300, the revelation of facets 310 of orientation <111> is carried out by chemical attack using KOH or potassium hydroxide. The starting substrate 300 is masked and the chemical attack takes place in the openings of the mask 331, thus forming grooves 320. The attack time defines the etching depth and therefore the height of the facets <111> 310 exposed. Since GaN growth has a+c orientation on the facets <111> 310 of the silicon, the initial orientation of the silicon is selected specifically so as to select the required semi-polar orientation of the surface of the layer of GaN.

Figure 3A:
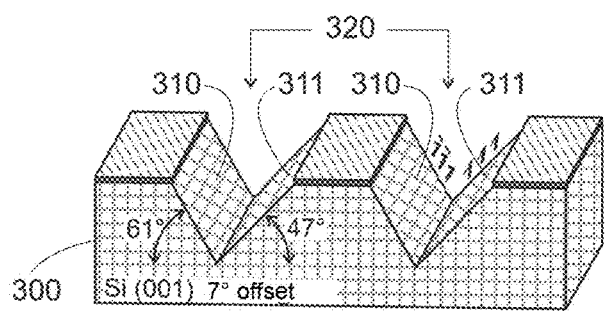
FIG. 3, consisting of FIGS. 3a to 3d, illustrates a type of technique which was developed for overcoming the problems related to a crystalline growth of a GaN-based material along a polar axis.
Figure 3B:
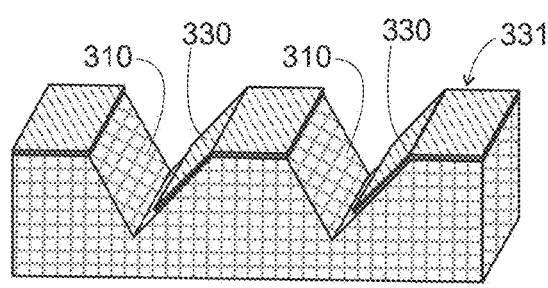

As shown in FIG. 3b, the method consists of protecting all of the surfaces, with the exception of the facets 310 of orientation ($\bar{1}\bar{1}1$) from which the growth will be performed, by carrying out the deposition of a mask 331.

The mask 331 is, for example, obtained by deposition of a masking layer 331 in a direction inclined in relation to the perpendicular with the upper surface of the substrate 300 in such a way as to cover the surfaces of the facets 330. The inclination is such that it leaves only the facets 310 free of oxide.

The masking layer 331 is preferably formed of a dielectric, for example, SiO2 or SiN or a combination thereof.

Figure 3C:
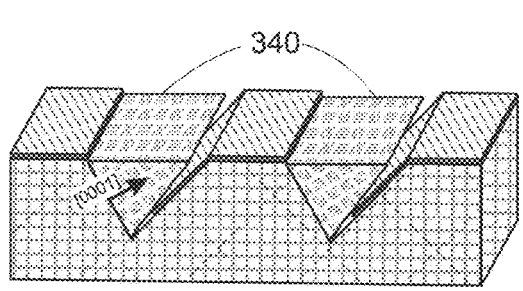

As shown in FIG. 3c, the growth of the GaN-based material is therefore carried out from the facets 310 which are not protected by the masking layer 331, such as an oxide in the direction noted [0001]. The operation is continued until coalescence of the adjacent areas of growth 340 of the GaN-based material occurs. Therefore, as shown in FIG. 4d, a continuous semi-polar layer 350 of orientation ($10\bar{1}1$) in this case is obtained.

Other similar methods are possible, for example, starting from a silicon substrate of orientation (113) which makes it possible to obtain a continuous layer of the GaN-based material of orientation ($11\bar{2}2$) or even starting from a silicon substrate of orientation (114), with an offset of crystallographic orientation of one degree of angle in relation to said plane, which makes it possible to obtain a continuous layer of the GaN-based material of orientation ($20\bar{2}1$). A similar process also exist which is adapted for obtaining semi-polar layers on structured sapphire substrates.

However, a problem that is common to all of these hetero-epitaxial layers is that the crystalline structure thereof is significantly disrupted by the presence of a large number of defects, including, on one hand, so-called basal stacking fault (BSF) defects, and, on the other hand, so-called threading dislocation (TD) defects that propagate in the entire crystalline structure during the growth of the crystal.

A number of methods have been proposed to prevent and/or correct the various types of crystalline defects produced during the growth of the GaN-based material.

The present invention describes a solution that makes it possible to form a semi-polar nitride layer with a lower level of defects.

Figure 4G:
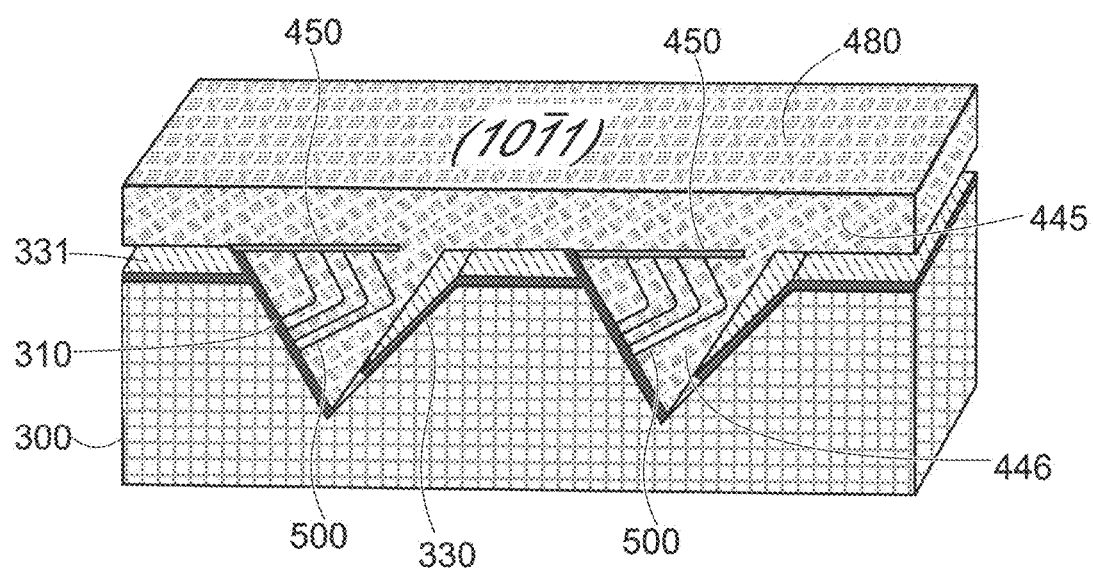
FIG. 4, consisting of FIGS. 4a to 4g, illustrates an example of method according to the invention.

FIG. 4, consisting of FIGS. 4a to 4g, illustrates other steps entering in the implementation of an example of method of the invention.

To reach the step illustrated in FIG. 4a, first the above-described steps in reference to FIGS. 3a and 3b are performed. These preliminary steps 3a and 3b therefore belong to the method according to the present invention.

In the case where the semi-polar layer to be formed is made of gallium nitride (GaN), a buffer layer 410 of aluminium nitride (AlN) is formed, directly in contact with the facets 310 having a crystalline orientation <111>, as was mentioned in the description of FIG. 3. Said buffer layer 410 turned out to be effective, in particular, for reducing chemical reactions between gallium and silicon resulting in melt-back etching.

Indeed, the growth of GaN on a silicon substrate encounters difficulties related to the occurrence of a "melt-back etching" phenomenon during the growth stage of the nitride layer such as a layer of GaN. Said destructive phenomenon is explained by the reactivity of silicon with Gallium. In particular, during the crystallite growth phase, silicon sees the temperature thereof increase sufficiently for it to be able to react with gallium. Said reaction generally results in the hollowing of cavities in the silicon.

Said cavities deteriorate the qualities of the substrate and therefore the performances of the LEDs. Moreover, they appear randomly on the surface of the silicon which leads to low homogeneity of the LEDs obtained from the same stack of layers.

The formation of a buffer layer of aluminium nitride (AlN) on the silicon before starting the growth of GaN makes it possible to avoid or limit said untimely etching of the silicon by the gallium.

As indicated in the non-limiting example above, the substrate may be made of monocrystalline or crystalline silicon. In this case, it may concern a solid silicon substrate or a silicon-on-insulator (SOI) type developed substrate. According to an alternative embodiment, the crystalline substrate is formed of Ge or GaAs or even an alloy of the following materials: Si, Ge, GaAs. The alloy may, for example, be SiGe. Generally, it concerns a substrate of cubic symmetry, therefore making the appearance of facets having a crystalline orientation <111> possible.

Then, the growth of the GaN-based semi-polar layer is carried out from the facets 310 having a crystalline orientation <111>. If said facets 310 having a crystalline orientation <111> are covered with a buffer layer 410 of AlN, then the semi-polar layer of GaN grows from said buffer layer 410 of AlN.

Figure 3D:
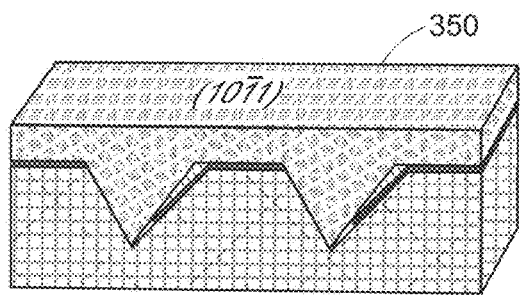

The growth of the semi-polar layer is interrupted before coalescence of the areas 340 and therefore before obtaining the result illustrated in FIGS. 3c and 3d.

As shown in FIG. 4a, the growth of the GaN based material is nevertheless continued until a seed 440 is obtained in view of a subsequent resumption of growth.

The parameters for growing a seed 440 or crystal as shown in FIG. 4a are selected in such a way as to protect an inclined facet 442 with a crystalline orientation (0001). Said crystal also has an upper face 441, the crystalline orientation of which is ($10\bar{1}1$).

In a specific and non-limiting example of implementation of the method of the invention, the growth of the GaN-based material is performed in a chamber or confined enclosure at a temperature of 1210° C., under a pressure of 300 millibar for a period of 3000 seconds, i.e. 50 minutes. Preferably, the growth of the seed 440 is performed by MOCVD, acronym for metal organic chemical vapour deposition. Said growth is preferably carried out directly from the buffer layer 410 of AlN. The V/III mole ratio of gallium-based nitride is in said example 650. More generally, it is between 550 and 750.

Naturally depending on the parameters selected for the growth, the seed shapes and facet sizes obtained may be different.

By controlling the growth time, it is ensured that the seed 440 does not form a complete pyramid and has indeed an inclined facet 442 the crystalline orientation of which is (0001). For example, for V-shaped grooves, of depth between 50 nm and 15 µm, a growth of GaN for a period of 3000 seconds makes it possible to obtain in each groove 320 an inclined facet 442, the width "w" of which is greater than 30 nm and preferably between 100 and 2000 nm and preferably to the order of 200 nm. Said width w, referenced in FIG. 4a is taken in a direction contained in the plane of said inclined facet 442 and perpendicular to the main direction in which the groove 320 lies.

Generally, to determine the growth time of the seed 440 and stop same in time so that it forms an inclined facet 442, the crystalline orientation of which is (0001), the following parameters in particular are taken into account: gas flow ratio, temperature, pressure, etc.

As illustrated in FIG. 4b, a step for modifying an upper portion of the seed 440 is performed.

Said step comprises a surface treatment of the seed 440. It makes it possible to obtain a surface area that is modified by incorporating silicon. Said area or modified portion is referenced 450 in FIG. 4b and following.

Said modified portion comprises silicon (Si) and possibly silicon nitride (SiN). More generally, said modified portion 450 comprises at least gallium (Ga), nitrogen (N) and silicon (Si). According to one embodiment, it only contains gallium (Ga), nitrogen (N) and silicon (Si).

Naturally, apart from said portion modified by said treatment step, the seed 440 does not comprise silicon.

By way of non-limiting example, the silicon content of the modified portion 450 located above the upper facet 441 is 5 atomic %. More generally, the silicon content of the modified portion 450 located above the upper facet 441 is between 3 atomic % and 10 atomic %. More generally, the silicon content of the modified portion 450 located above the upper facet 441 is between 3 atomic % and 20 atomic %. Said contents make it possible to modify the upper portion of the GaN in such a way as to very effectively block the dislocations at the level of the upper facet 451 whilst enabling a resumption of epitaxial growth at the level of the semi-polar facet 452 of orientation (0001).

Said modified portion 450 comprising silicon is at least located on the upper face 441 of the seed 440.

Preferably, said treatment is carried out in-situ, in the same chamber as the previous operation, by maintaining the same pressure and temperature conditions. Advantageously, the modification of said portion 450 is preferably carried out by MOCVD. Said type of treatment makes it possible to limit said modified portion 450 to a very low thickness as will be specified below. Moreover, this makes it possible to not change chambers during the various steps which is advantageous in terms of simplicity and cost of the method.

The modification of said portion 450, comprising Si in this case, is, for example, performed by injecting into the chamber, for 70 seconds in said example, on one hand: ammonia (NH3) in gaseous form with a flow rate of 5 slm, acronym for "standard litre per minute", and, on the other hand: silane (SiH4) with a flow rate of 100 sccm, acronym for "standard cubic centimetre per minute". Naturally, very different values of said parameters may be used to obtain the modification of said portion 450. To control the thickness of said modified portion, the following parameters, for example, will be adjusted: temperature, gas flow ratio, pressure, etc.

According to other non-limiting examples, values from the following intervals may be taken:
SiH4 flow: between 5 and 3000 sccm
NH3 flow: between 0.2 and 15 slm
Temperature: between 600 and 1200° C.
Pressure: between 20 and 800 mbar The modified portion comprising silicon 450 is a very thin layer, the thickness of which, taken on the upper surface 441 of the seed 440 is greater than a monoatomic thickness (i.e. the thickness of a monoatomic layer or monolayer of the material constituting the modified portion 450) and, preferably, greater than the thickness of two atomic layers. It is more generally between a monoatomic thickness and sixteen atomic layers, that is, typically, in a thickness range from 0.3 nanometres (or nm=$10^{-9}$ metre) to 5 nm.

More generally, the modified portion comprising silicon 450 is formed by gas injection into the chamber for a period between 10 and 100 seconds.

Unexpectedly, it is noted that the modification of GaN by incorporating silicon, is carried out selectively on the upper facet 441 of seed 440 and is not carried out or not in a continuous way, in particular, on the inclined facet 442 of orientation (0001).

It was observed that on the inclined facet 442 of the seed 440, the treatment by incorporating Si is not continuous and leaves regions wherein there is no Si.

Said discontinuity of the modification of the seed makes it possible that a resumption of growth of the GaN can then be carried out from said facet 442. Typically, the thickness of the modified portion comprising silicon 450 taken on the inclined surface 442 of the seed 440 is equal to or strictly less than a layer. Thus, the modified portion comprising silicon has on the inclined facet a thickness less than or equal to 0.3 nm.

Conversely, the treatment leads to a continuous modification of the GaN on the entire upper facet 441, thus forming a continuous portion 450 comprising Si on said upper facet 441.

Then, in the same equipment and for, for example, 10 minutes without said period being limiting in said context, the growth of the GaN-based material is resumed using the same conditions as for the initial growth of the seed 440. As shown in FIG. 4c, after modifying the portion 450 by incorporating silicon, the resumption of nucleation of the GaN-based material therefore only occurs from the inclined facet 442 of orientation (0001). The seed 440 therefore has the extension 460 illustrated in FIG. 4c. No nucleation is noted either on the upper facet 441 of orientation (10$\bar{1}$1) covered by the modified portion 450 comprising silicon.

Said absence of growth of GaN from the upper facet 441 when GaN grows from the inclined facet 442 of orientation (0001) may be based on a plurality of explanations. In the context of development of the present invention, a plurality of explanations were envisaged to try and understand said growth difference of GaN. It is probable that the combination of said explanations is at the origin of said growth difference of GaN.

A possible explanation would be that the discontinuity of the modification on the inclined facet 442 makes a resumption of epitaxial growth of GaN possible there where the inclined facet 442 is not modified whereas the continuous modification on the upper facet 441 blocks the resumption of growth.

Another possible explanation would be that at the intersection between the upper facet 441 and the inclined facet 442, there are no more bonds available for re-initiating the growth there, this favouring the growth of GaN at said intersection.

Another possible explanation would be that the differences in terms of deposition velocity and in terms of density and crystalline structure relating to the modified portion 450 comprising silicon on the upper facet 441, on one hand, and on the upper facet 442, on the other hand, induce different affinities with the GaN and the possibility or not of continuing growth by nucleation.

As shown in FIGS. 4d to 4g, the growth of the GaN-based material then continues laterally 470 until the modified portion 450 comprising silicon is completely covered as illustrated in FIG. 4f.

In a particularly advantageous way, the modified portion 450 comprising silicon prevents the propagation of threading dislocations (TD) in the upper portion 445 of the seed 440, that is the portion located above the modified portion 450. It seems that on contact with the modified portion 450 comprising silicon, said dislocations bend and propagate in a plane parallel to said modified portion 450 but without passing therethrough. The dislocations thus remain confined in the lower portion 446 of the seed 440, that is the portion located below the modified portion 450.

At the level of the inclined facet 442 of orientation (0001), the dislocations do not propagate in the upper portion 445 of the seed 440 located above the modified portion 450 comprising silicon.

FIG. 4g illustrates the result obtained after continuing the growth of the semi-polar layer 480 until coalescence of seeds 440.

The dislocations 500 that propagate from the facets <111>/AlN/GaN interface then that bend and the progression of which in the plane is stopped by the modified layer 450 comprising silicon are shown schematically in this figure.

The semi-polar layer 480 thus obtained may then be detached from its substrate 300 to form a microelectronic device.

Figure 5:
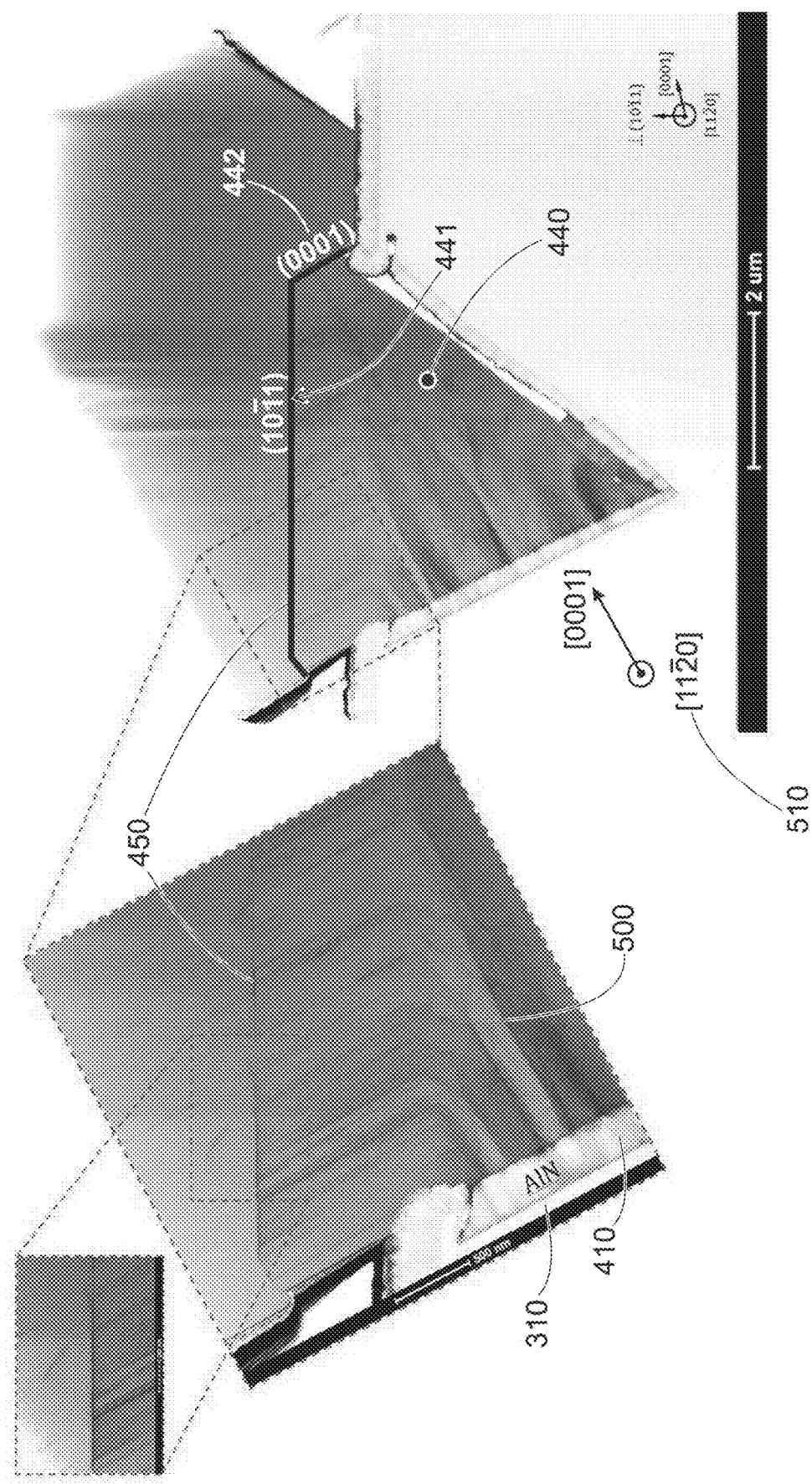
FIG. 5 shows the experimental results obtained with the method of the invention.

FIG. 5 shows photos of samples of GaN crystals that were produced according to the method of the invention described in the previous figure. The photos were taken using a "Scanning Transmission Electron Microscopy" (STEM) system. FIG. 5 shows cross-sectional images of the area of a crystal, the growth of which was obtained as previously described, that is from the facet 442 of a pyramid-shaped seed 440. The photos were acquired with various magnifications in the axis of area [1120] 510. It can be seen here that the threading dislocations (TD) 500 are completely blocked in the plane where the modified portion comprising silicon 450 is present.

On the observations carried out on the seed after modification by incorporating Si, the appearance of a different crystallinated layer is not seen at the interface where the treatment by incorporating Si into the GaN was carried out. Only a chemical contrast variation is seen at said interface. The treatment time, temperature, pressure of the reactor and the gas flows used for this treatment are the adjustment parameters that control the thickness of said interfacial area.

A number of variants can be added to the non-limiting embodiment described in reference to FIGS. 3a and 3b and 4a to 4g.

For example, the grooves 320 are not necessarily V-shaped. They may have a flat bottom. The facets 310 having a crystallographic orientation <111> may thus be stopped on a groove bottom without directly joining the opposed facets 311.

The invention is not limited to the above-described embodiments and extends to all of the embodiments covered by the claims.

The invention claimed is:

1. A method for obtaining at least one semi-polar nitride layer obtained from a gallium and nitrogen based material on an upper surface of a crystalline substrate of cubic symmetry, the method comprising:
   (i) etching a plurality of parallel grooves from the upper surface of the crystalline substrate, each groove comprising at least two opposed inclined facets, at least one of the two opposed facets having a crystalline orientation <111>;
   (ii) forming a mask above the upper surface of the crystalline substrate such that the facets opposite to the facets having the crystalline orientation <111> are masked and that the facets having the crystalline orientation <111> are not masked; and
   (iii) after forming the mask in (ii), forming the semi-polar nitride layer by epitaxial growth from the non-masked facets having the crystalline orientation <111>;
   wherein forming the semi-polar nitride layer in (iii) comprises:
      at least one first epitaxial growth phase, carried out from the non-masked facets having the crystalline orientation <111> so as to form a seed in a plurality at least of parallel grooves;
      interrupting of the first epitaxial growth phase when the seed has an inclined facet having a crystalline orientation 0001 and an upper facet having a crystalline semi-polar orientation 10$\bar{1}$1;
      a surface treatment comprising a modification of an upper portion of the seed by placing the seed in presence with at least one gas comprising silicon so as to form on the surface of the seed a modified portion comprising silicon; and
      at least one second epitaxial growth phase of the material, carried out from the inclined facet having the crystalline orientation 0001, the second epitaxial growth phase being continued until coalescence of seeds of adjacent parallel grooves.

2. The method of claim 1, wherein during the second epitaxial growth phase the semi-polar layer of nitride covers one part at least of the modified portion comprising silicon.

3. The method of claim 1, wherein the modified portion comprising silicon is continuous on the upper facet of the seed.

4. The method of claim 1, wherein the modified portion comprising silicon is absent or discontinuous on the inclined facet having the crystalline orientation 0001.

5. The method of claim 1, wherein the silicon content of the modified portion located above the upper facet having the crystalline semi-polar orientation 10$\bar{1}$1 is between 3% and 20% in atomic percentage.

6. The method of claim 1, wherein the modification of an upper portion of the seed comprises an exposure of the seed to a combined flow of gas comprising SiH4 and NH3.

7. The method of claim 6, wherein a thickness of the modified portion comprising silicon is controlled by regulating at least a ratio of flow rates of SiH4 and NH3 and/or by regulating an exposure time.

8. The method of claim 1, wherein a thickness of the modified portion comprising silicon is controlled by regulating at least one parameter selected from the group consisting of flow rate, temperature, and injection pressure of at least one gas comprising silicon.

9. The method of claim 1, wherein the modified portion comprising silicon sitting on top of the upper facet has a thickness strictly greater than one monoatomic layer.

10. The method of claim 1, wherein the modified portion comprising silicon sitting on top of the upper facet has a thickness strictly greater than 0.3 nm.

11. The method of claim 1, wherein the modified portion comprising silicon sitting on top of the inclined facet has a thickness less than or equal to one single monoatomic layer.

12. The method of claim 1, wherein the modified portion comprising silicon sitting on top of the inclined facet has a thickness equal to or less than 0.3 nm.

13. The method of claim 1, wherein at least one first epitaxial growth phase and the modification of an upper portion of the seed are performed in the same reactor.

14. The method of claim 1, wherein the modification of an upper portion of the seed is performed by metalorganic chemical vapor deposition.

15. The method of claim 1, wherein the interruption is triggered after a predetermined period.

16. The method of claim 1, wherein the first epitaxial growth phase of the material from the facet having the crystalline orientation <111> is interrupted before the seed fills the groove.

17. The method of claim 1, wherein before the epitaxial growth stage of the material from the facets having the crystalline orientation <111>, a buffer layer of AlN is formed on the facets having the crystalline orientation <111>.

18. The method of claim 1, wherein the crystalline substrate comprises at least one material selected from the group consisting of Si, Ge, and GaAs.

\* \* \* \* \*